United States Patent [19]

Anderson et al.

[11] 4,032,904
[45] June 28, 1977

[54] MEANS FOR REFRESHING AC STABLE STORAGE CELLS

[75] Inventors: Kevin Lee Anderson, Winooski; Luis Maria Arzubi, Colchester, both of Vt.

[73] Assignee: International Business Machines Corporation, Armonk, N.Y.

[22] Filed: July 9, 1975

[21] Appl. No.: 594,382

[52] U.S. Cl. .................................... 340/173 DR
[51] Int. Cl.² ...................................... G11C 7/00
[58] Field of Search .............. 340/173 DR, 173 RC

[56] References Cited

UNITED STATES PATENTS

| | | |
|---|---|---|
| 3,731,287 | 5/1973 | Seely et al. ................. 340/173 DR |
| 3,737,879 | 6/1973 | Greene et al. .............. 340/173 DR |
| 3,836,892 | 9/1974 | Desimone et al. .......... 340/173 DR |
| 3,859,640 | 1/1975 | Eberlein et al. ............. 340/173 RC |

Primary Examiner—Stuart N. Hecker
Attorney, Agent, or Firm—Edward S. Gershuny

[57] ABSTRACT

A refresh circuit for AC stable storage cells utilizing an asymmetric a stable power source for controlling an auxiliary shift register which in turn controls the refreshing shift register. The outputs of the refreshing shift register are coupled to the gate electrodes of gating devices coupled to the memory word line.

4 Claims, 4 Drawing Figures

MEANS FOR REFRESHING AC STABLE STORAGE CELLS

INTRODUCTION

This invention relates generally to electronic storage systems comprising randomly accessible DC stable storage arrays which utilize AC stable storage cells. More particularly, the invention relates to improved means for refreshing the storage cells.

DESCRIPTION OF THE PRIOR ART

The prior art contains numerous devices, systems and techniques for storing electronic data. For many years, ferrite core matrices dominated large random access storage systems. Now, with the advent of integrated circuits and monolithic technology, thousands of active circuit devices, such as transistors, can be placed on a single semiconductor chip having an area as small as one hundred square mils or less. It has thus become possible to fabricate bistable circuits, such as flip flops, of sufficiently small size and packaging density to compete favorably with the bistable ferrite cores used in core storage systems. These semiconductor storage cells are bistable circuits, the binary value of the stored data being determined by the state of the bistable circuit. These bistable circuits may be functionally characterized as DC stable or AC stable. DC stable storage cells generally retain their data until it is altered by a "write" operation. On the other hand, AC stable cells retain the stored information only for limited intervals of time after which the information must be "refreshed" or it is permanently lost.

A prior art AC stable storage is exemplified by U.S. Pat. No. 3,541,530 issued Nov. 17, 1970 to D. P. Spampinato et al for PULSED POWER FOUR DEVICE MEMORY CELL. The patent relates to a four device field effect transistor (FET) AC stable storage cell that is entirely compatible with the present invention, and is hereby incorporated by this reference.

AC stable storage cells generally have the advantages of minimizing stand-by power consumption, eliminating power sources normally required for DC stable cells, and small lay-out area in the semiconductor chip because fewer semiconductor devices are required (resulting in increased packaging density). These advantages have sometimes been outweighed by the disadvantage that information is stored only for a limited period of time after which it must be refreshed. Most prior art techniques for refreshing AC stable storage cells utilize one of two basic techniques. The first technique requires that the storage system reserve every alternate cycle for refreshing or regenerating data. This results in a variable access time to the storage. That is, if the storage is not being refreshed when the system desires access to it, then the minimum access time designed into the storage prevails; however, if the system desires to access the storage during a refresh cycle, then the delay of the refresh cycle is encountered in addition to the minimum access time. This variable access time is highly undesirable to system designers. The second technique, referred to as a bust mode of operation, reserves a fixed interval of time (10 percent for example) in every cycle which is used for regeneration and therefore forbidden to the system. This technique is also undesirable to system operation and, at best, requires that cycle times be increased to allow for the time required for regeneration.

Many of the above disadvantages are overcome in another prior art technique described in U.S. Pat. Ser. No. 3,836,892 issued Sept. 17, 1974, application Ser. No. 267,719 filed June 29, 1972 by R. R. Desimone et al for D.C. STABLE ELECTRONIC STORAGE UTILIZING A.C. STABLE STORAGE CELL. In that application, which is incorporated herein by this reference, a storage array comprised of AC stable storage elements is systematically regenerated by a pulse train from a asynchronous pulse source. The frequency of the pulse source is determined primarily by the retention time of each AC stable cell and the time interval required to regenerate it, although other factors are considered for optimization. Whenever the system desires access to the storage array, the regenerating pulses are inhibited. At no time is the system accessing signal to the storage array delayed because of the regeneration technique.

One disadvantage that is common to the prior art techniques described above is that, even while a chip is unselected, there is always a word line up. This means that power is being dissipated unnecessarily after the data has already been refreshed.

Another disadvantage of the prior art is the possibility of a "race condition" between recovering the bit lines after a write operation and the bringing up of a word line by the shift register.

BRIEF DESCRIPTION OF THE INVENTION

The above and other disadvantages of the prior art are overcome in accordance with one aspect of this invention by providing a system wherein an asymmetric astable power source controls an auxiliary shift register which, in turn, controls the refreshing shift register. The outputs of the refreshing shift register are coupled to the gate electrodes of gating devices that are coupled to the memory word lines. In a preferred embodiment of the invention, the auxiliary shift register contains four stages, only one of which contains a "1", and by means of which two phase signals can be generated which have the minimum width required to refresh the cells and the maximum refreshing periodicity. These two phase signals are sent to the refreshing shift register to refresh the AC storage cells. The shift register driver drives the gate of the device that pulls the word line up (rather than its drain as in prior art techniques) thus minimizing the load to be driven by the shift register driver.

A significant advantage of this invention is that, after data has been refreshed and the chip is not selected, the word line is not up. This results in a considerable power saving.

Another advantage is that this invention eliminates the race condition between recovering the bit lines after a write and the bringing up of a word line by the shift register. Elimination of this race condition will enhance the reliability of the memory.

Still another advantage of the invention is the substantial elimination of the capacitive load imposed by the gates of the devices that, in prior art techniques, are in series with the word lines.

The above and other objects, features and advantages of the invention will be apparent from the following more particular description of a preferred embodiment thereof as illustrated in the accompanying drawings.

DETAILED DESCRIPTION

Figure 1:
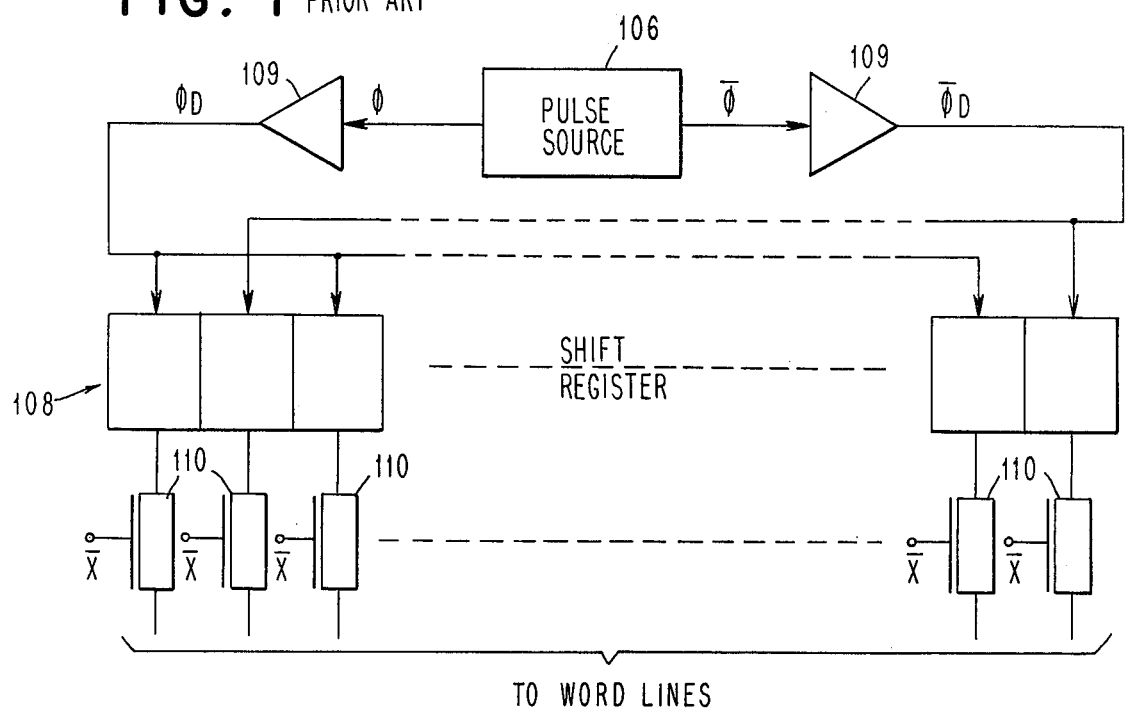
FIG. 1 shows various aspects of the refresh mechanism of a prior art storage array.

Prior Art (FIG. 1)

A typical memory system is made up of several storage arrays, each array comprising a plurality of AC stable storage cells. It will contain a bit decoder from which, typically, 64 pairs of bit/sense (B/S) lines go to each array. There are also 32 word lines (W/L) entering each array from a word decoder through a set of gates. Each such array is therefore capable of storing 64 × 32 = 2048 bits of information. This is commonly referred to as a 2K bit array. The density of integration is limited only by existing technology. If the technology is limited to 512 bits on a single semiconductor chip, then the storage array would require four chips. On the other hand, such an array along with its control circuitry could be placed on a single semiconductor chip of appropriate size, with appropriate technology. Whatever number of cells are placed on a particular chip, the corresponding associated support circuitry for those bits would be on the same chip. Similarly the associated regeneration circuitry is on the same chip with the cells to be regenerated.

Referring to FIG. 1, various aspects of the regeneration mechanism will be described. Asynchronous pulse source 106 provides two sets of pulse trains to shift register 108 through drivers 109. A 32 bit shift register is shown to accommodate the 32 word lines. Each of the 12 outputs of shift register 108 is connected to a corresponding word line through a gating transistor 110. A control circuit (not shown) receives an input from each of the outputs of shift register 108 and provides an input signal thereto. For purposes of saving power, it is preferred that only one of the stages of shift register 108 contain a binary 1, while the remaining stages each contains a "0". This function could be accomplished in any one of a number of well known ways. For example, the control circuit could insert a 1 into the first stage of shift register 108 and reinsert a 1 as the previously inserted 1 is shifted out of the last stage. Thus, the control circuit could comprise an Exclusive-OR circuit which provides a 1 output only when all 32 inputs are 0. In the alternative, shift register 108 could be of the recirculating ONE type so that once a 1 is inserted it continues to be reinserted into the first stage as it is shifted out of the last stage. These details of shift register operation and control are well known to those skilled in the art.

For additional details with respect to the prior art briefly described above, reference is again made to copending application Ser. No. 267,719.

DETAILED DESCRIPTION OF THIS INVENTION

In prior art refreshing mechanisms as exemplified by FIG. 1, the phase pulses for the refreshing shift register are provided by the simple combination of a pulse generator and drivers. With this invention, a small amount of complexity is added to the system. However, the advantages realized by using this invention far outweigh the possible disadvantages of having the additional circuitry.

Figure 2:
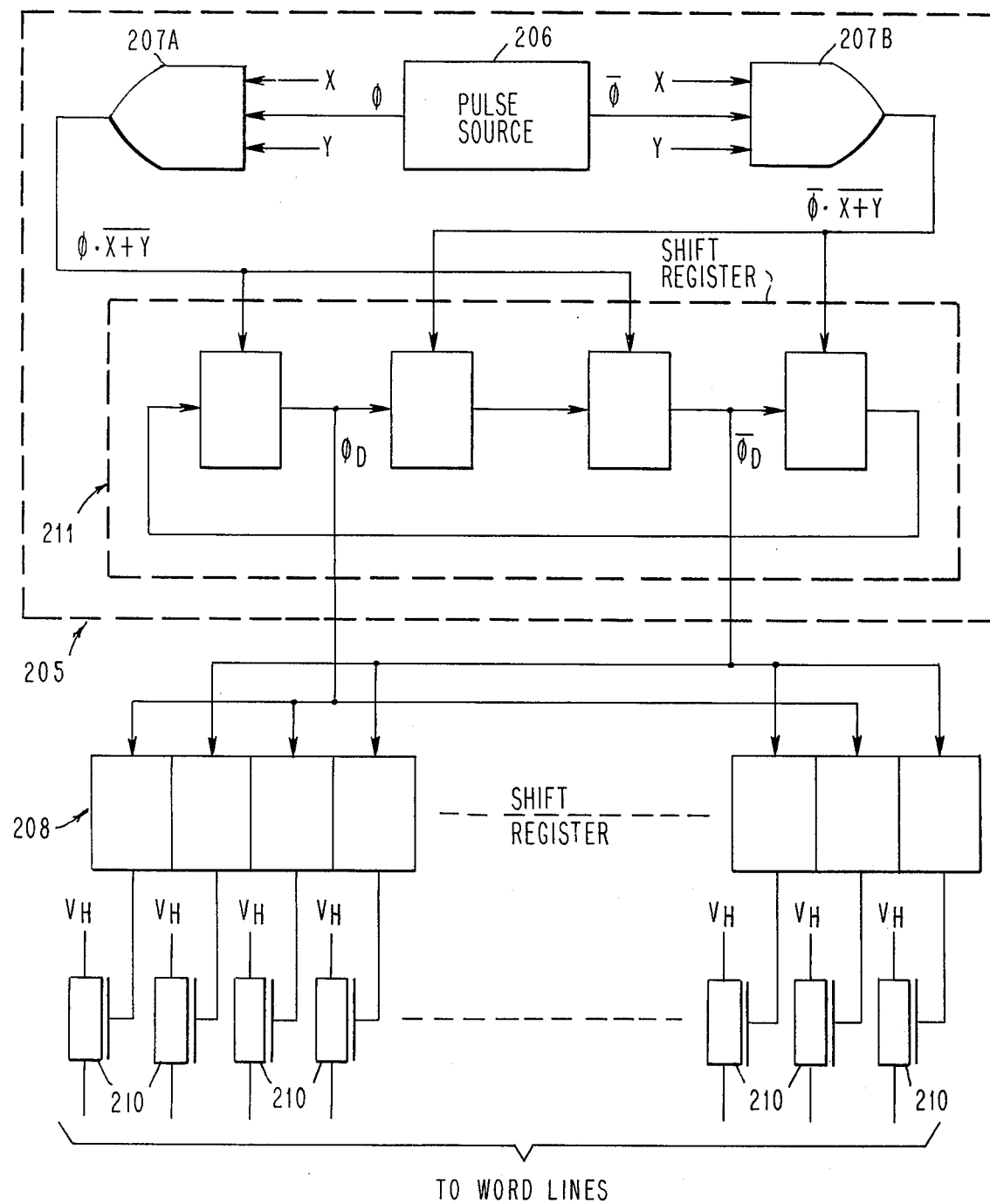
FIG. 2 is a diagram of a preferred embodiment of this invention.

In FIG. 2, the mechanism for generating phase pulses that will be transmitted to the regenerating shift register 208 is enclosed within the broken line 205. It includes an asynchronous pulse generator 206 (which may be the same as the pulse generator 106 utilized in the prior art system of FIG. 1), two pulse combining means 207 (which will be described in detail below) and a four-stage auxiliary shift register 211.

The astable pulse source 206 is preferably one for which the pulse with the minimum width is $2\bar{X} + CS$ and the pulse with the maximum width is (refreshing periodicity)/(number of word lines) $- 2\bar{X} + CS$. This is the pulse that is shown as $\phi$ in FIG. 2. The inverse of this pulse, $\bar{\phi}$, is the other output of the pulse generator.

In the above description, and in the description to follow: $\phi$ and $\bar{\phi}$ represent the phase pulses generated by pulse generator 206; X is the vertical select pulse (and $\bar{X}$ is its inverse); Y is the horizontal select pulse (and $\bar{Y}$ is its inverse); $\phi_D$ and $\bar{\phi}_D$ are the phase pulses that are transmitted to the refreshing shift register; and $V_H$ is the most positive supply. The manner in which each of these pulses may be generated in a memory system is well known to those skilled in the art and need not be described herein.

In pulse combining mechanism 207A, $\phi$, X, and Y are combined to produce the phase pulse $\phi \cdot \bar{X} + \bar{Y}$ which controls the first and third stages of the four-stage auxiliary shift register 211. Phase combining mechanism 207B combines $\bar{\phi}$, X and Y to produce the phase pulse $\bar{\phi} \cdot \bar{X} + \bar{Y}$ which controls the second and fourth stages of shift register 211. $\phi_D$ and $\bar{\phi}_D$ are taken, respectively, from the outputs of the first and third stages of the shift register and are transmitted to the refreshing shift register 208 as shown. Auxiliary shift register 211 is controlled in such a manner that one, and only one, of its stages contains a 1 and the other three stages all contain 0. In the preferred embodiment of the invention, as shown in FIG. 2, auxiliary shift register 211 is a recirculating shift register which has initially been loaded with a single 1 which, when it is shifted out of the fourth stage, will reenter the first stage. Of course, as discussed above under the heading Prior Art (FIG. 1), other means could be used to insure that the auxiliary shift register contains only a single 1.

Referring back to FIG. 1, it will be noted that in the prior art each output of the refreshing shift register 108 drives the drain of a gating transistor 110 that is connected to the word line of the memory array. A significant distinction of this invention over the prior art is that, as shown in FIG. 2, the stages of the refreshing shift register 208 drive the gates of gating transistors 210 which are connected to the word lines of the memory array. Two of the significant advantages that result from this arrangement are that (1) the load to be driven by the refreshing shift register is minimized and (2) the capacitive load imposed to the X generator when it is connected to the gates of the switching transistors is eliminated.

Figure 3:
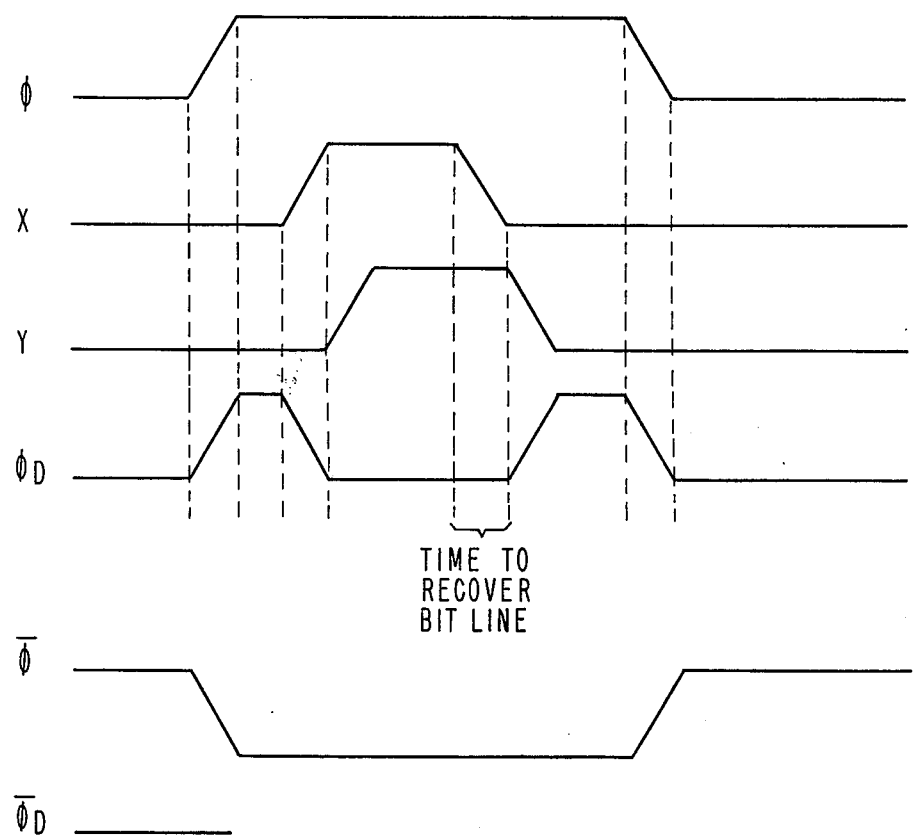
FIG. 3 is a waveform diagram.

FIG. 3 shows the timing relationship among six of the significant signals utilized, and generated, for controlling the shifting of refreshing shift register 208 (FIG. 2). One of the significant advantages of this invention that is readily apparent from FIG. 3 is the elimination of the race condition between recovering the bit lines after a write operation and the bringing up of a word line by the shift register. Note that after X (the vertical select pulse) begins to fall neither $\phi_D$ nor $\overline{\phi}_D$ can begin to rise until Y (the horizontal select pulse) also begins to fall. Since there can be no refresh cycle until $\phi_D$ or $\overline{\phi}_D$ begins to rise, there will typically be approximately 0.02 microseconds during which the bit lines can be recovered.

Figure 4:
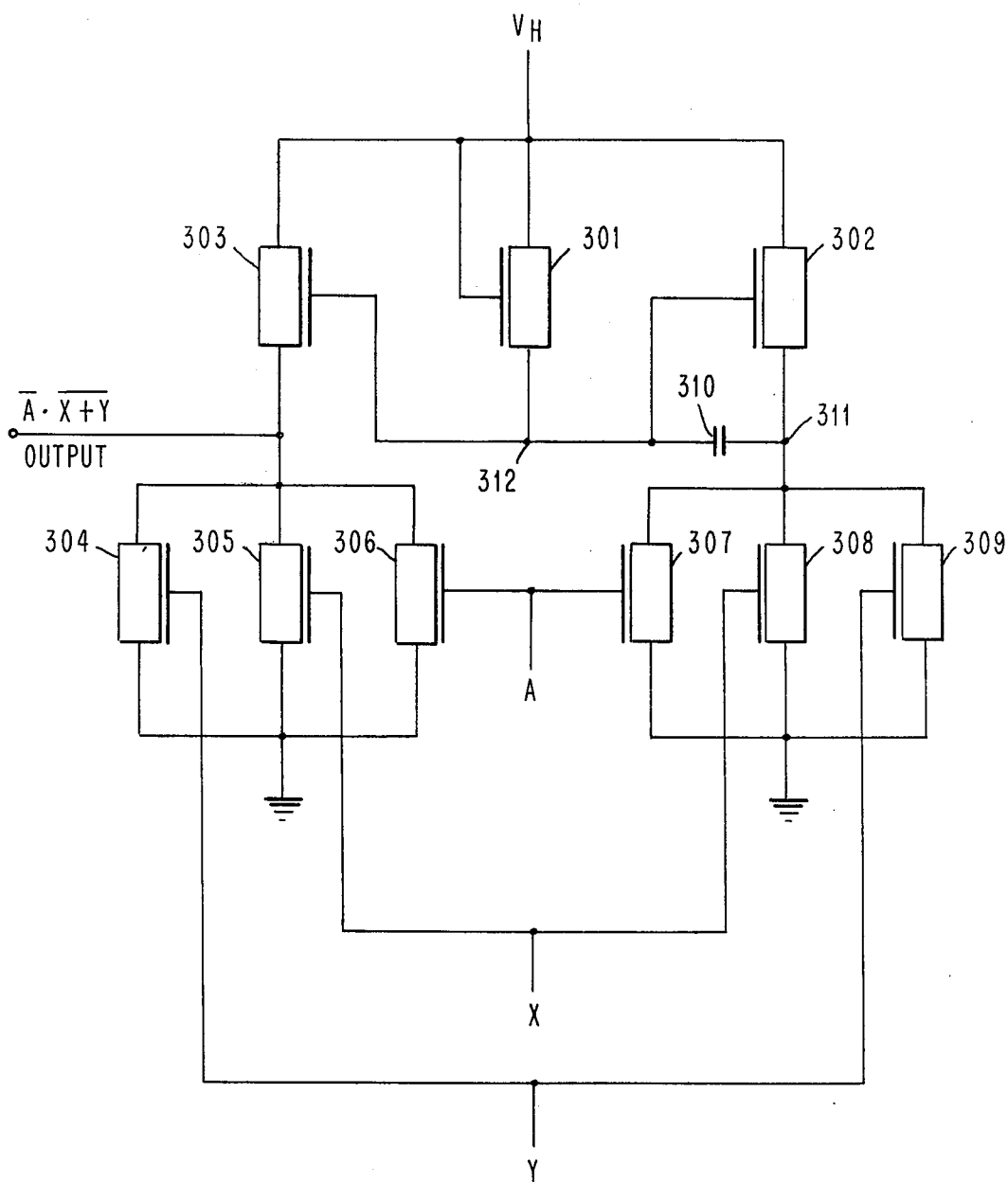
FIG. 4 is a circuit of a preferred embodiment of means for generating certain signals required for refreshing the data

FIG. 4 is a circuit diagram of a preferred circuit for producing an output $\overline{A} \cdot \overline{X+Y}$ when its inputs are A, X and Y. In FIG. 4 $V_H$, X and Y have the same meaning that has been ascribed to them above. A represents either of the inputs $\phi$ or $\overline{\phi}$. The figure comprises nine transistors 301 through 309 and a capacitor 310, all connected as shown.

If one or more of the signals A, X and Y is up, capacitor 310 will be precharged through transistor 301 and one or more of transistors 307, 308 and 309, respectively. The output of the circuit will then be kept at ground through one or more of transistors 306, 305 and 304, respectively. Then, when X and Y both fall while A remains down, transistors 304, 305, 306, 307, 308 and 309 will be off, causing nodes 311 and 312 to rise. Transistor 303 will be strongly on. This will cause the output of the circuit to rise, thereby generating $\overline{A} \cdot \overline{X+Y}$.

When the chip containing this circuit is unselected, both X and Y are down. In the unselected state, $\overline{X+Y}$ is continually up, and the output $\overline{A} \cdot \overline{A+Y}$ will simply be A. Therefore, refreshing of the memory array will follow its normal cycle by shifting data through the refreshing shift register and turning on the gating transistors sequentially.

When the chip is selected, first X will go up (thus bringing down $\overline{X+Y}$ and, consequently, the circuit output $\overline{A} \cdot \overline{X+Y}$) and refreshing will be interrupted. Then, Y will rise and data in the memory array will be accessed and/or modified. Then X will fall and recovery of the bit line will start. After recovery of the bit line is complete, Y falls (since X is still down, $\overline{X+Y}$ will rise) and the output of the circuit shown in FIG. 4 will again be equal to $\overline{A}$. Refreshing of the array will recommence through gating transistors 210 (FIG. 2) after the bit lines have been recovered.

The above description of the circuit shown in FIG. 4 assumes that transistors 301 through 309 are n-channel MOS transistors. Of course, the circuit could be built utilizing p-channel transistors, in which case the above description would still be valid except that the polarities would need to be reversed.

Those skilled in the art will recognize that a minor modification would need to be made if the circuits shown in FIG. 4 were to be utilized for the pulse combining devices 207A and 207B shown in FIG. 2. This is because the circuit shown in FIG. 4 generates an output $\overline{A} \cdot \overline{X+Y}$ in response to inputs A, X and Y, while the diagram of FIG. 2 suggests that devices 207A and 207B should be of such a nature that their outputs are $A \cdot \overline{X+Y}$ in response to inputs of A, X and Y. The necessary modification could be accomplished in any of a variety of ways. For example, the input that is designated as A in FIG. 4 could include an inverter circuit so the input A would first be inverted and would appear to the remainder of the circuit as an input of $\overline{A}$, thus producing the desired output $A \cdot \overline{X+Y}$. Another, even simpler modification, if the circuit of FIG. 4 were to be used in the embodiment shown in FIG. 2, would be to connect the $\phi$ output of pulse source 206 to pulse combining circuit 207B and to connect the $\overline{\phi}$ output of pulse source 206 to the pulse combining circuit 207A. This would result in pulse combining circuits 207A and 207B having the outputs that are shown in FIG. 2.

While the invention has been shown and described with reference to a preferred embodiment thereof, those skilled in the art will recognize that the above and other changes may be made without departing from the spirit and scope of the invention.

What is claimed is:

1. An electronic data storage array including a plurality of storage cells which require periodic refreshing, means for generating phase pulses, and primary shifting means responsive to said phase pulses for circulating a 1 level signal at a shift rate determined by the frequency of said pulses; wherein said means for generating phase pulse comprises:
   a pulse generator for generating a train of pulses that is asynchronous with the cycle time of the storage array;
   pulse combining means responsive to said pulse generator for altering said train of pulses in a predetermined manner; and
   auxiliary shifting means responsive to said pulse combining means for circulating a 1 level signal at a shift rate determined by the frequency of the output of said pulse combining means;
   said auxiliary shifting means being connected to said primary shifting means for providing said phase pulses thereto.

2. The apparatus of claim 1 further including gating means connected between said primary shifting means and said storage cells:
   said gating means comprising a plurality of semiconductor devices, each having a gate input;
   said primary shifting means being connected to said gate inputs.

3. The apparatus of claim 1 further including means connecting vertical select pulses (X) and horizontal select pulses (Y) to said pulse combining means, and wherein:
   said pulse combining means comprises means responsive to said train of pulses and to said X and Y pulses to produce an output having the form $\phi \cdot \overline{X+Y}$ where $\phi$ represents said train of pulses.

4. The apparatus of claim 3 further including gating means connected between said primary shifting means and said storage cells:
   said gating means comprising a plurality of semiconductor devices, each having a gate input;
   said primary shifting means being connected to said gate inputs.

* * * * *